(12) United States Patent
Fitzi

(10) Patent No.: US 9,813,026 B2
(45) Date of Patent: Nov. 7, 2017

(54) AMPLIFIER ARRANGEMENT

(71) Applicant: ams AG, Unterpremstaetten (AT)

(72) Inventor: Andreas Fitzi, Staefa (CH)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 15/100,278

(22) PCT Filed: Sep. 25, 2014

(86) PCT No.: PCT/EP2014/070505
§ 371 (c)(1),
(2) Date: May 27, 2016

(87) PCT Pub. No.: WO2015/078611
PCT Pub. Date: Jun. 4, 2015

(65) Prior Publication Data
US 2017/0005622 A1    Jan. 5, 2017

(30) Foreign Application Priority Data
Nov. 28, 2013  (EP) .................................... 13194933

(51) Int. Cl.
*H03F 3/45* (2006.01)
*H03F 1/26* (2006.01)
*H03F 3/21* (2006.01)

(52) U.S. Cl.
CPC ............... *H03F 1/26* (2013.01); *H03F 3/21* (2013.01); *H03F 3/45183* (2013.01);
(Continued)

(58) Field of Classification Search
CPC ...................................................... H03F 3/45
(Continued)

(56) References Cited

U.S. PATENT DOCUMENTS

| 5,151,625 A | 9/1992 | Zarabadi et al. |
| 7,161,406 B1 * | 1/2007 | Ferris .................. H03D 7/1441 327/359 |

(Continued)

FOREIGN PATENT DOCUMENTS

| EP | 1420450 A2 | 5/2004 |
| JP | 2000228611 A | 8/2000 |
| JP | 4719412 B2 | 7/2011 |

OTHER PUBLICATIONS

Johnson, Ben, "An Orthogonal Current/Reuse Amplifier for Multi/Channel Sensing", IEEE, vol. 48, No. 6, Jun. 2013, pp. 1487-1496.

*Primary Examiner* — Henry Choe
(74) *Attorney, Agent, or Firm* — McDermott Will & Emery LLP

(57) ABSTRACT

An amplifier arrangement is presented, comprising a first differential stage (DS1) comprising at least two transistors (M1, M1') having a first threshold voltage (Vth1), at least a second differential stage (DS2) comprising at least two transistors (M3, M3') having a second threshold voltage different from the first threshold voltage, at least one of the transistors of the first and second differential stage (DS1, DS2), respectively, has a control input commonly coupled to an input of the amplifier arrangement, at least one transistor (M1) of the first differential stage and one transistor (M3) of the second differential stage are arranged in a common current path, which is coupled to an output of the amplifier arrangement.

12 Claims, 3 Drawing Sheets

(52) U.S. Cl.
CPC ..... *H03F 3/45237* (2013.01); *H03F 3/45273* (2013.01); *H03F 2203/45352* (2013.01); *H03F 2203/45366* (2013.01)

(58) Field of Classification Search
USPC .................................................. 330/253, 261
See application file for complete search history.

(56) References Cited

U.S. PATENT DOCUMENTS

| | | | |
|---|---|---|---|
| 7,877,075 B1 * | 1/2011 | Jin | H03D 7/1425 331/117 R |
| 8,577,322 B1 * | 11/2013 | Jin | H03D 7/1425 331/117 R |
| 2003/0094977 A1 | 5/2003 | Li et al. | |
| 2008/0284489 A1 | 11/2008 | Low | |
| 2008/0303579 A1 | 12/2008 | Ng et al. | |
| 2009/0184767 A1 | 7/2009 | Hayashi et al. | |
| 2009/0237161 A1 | 9/2009 | Fagg | |
| 2012/0025911 A1 | 2/2012 | Zhao et al. | |
| 2012/0054704 A1 | 3/2012 | Boecker | |

* cited by examiner

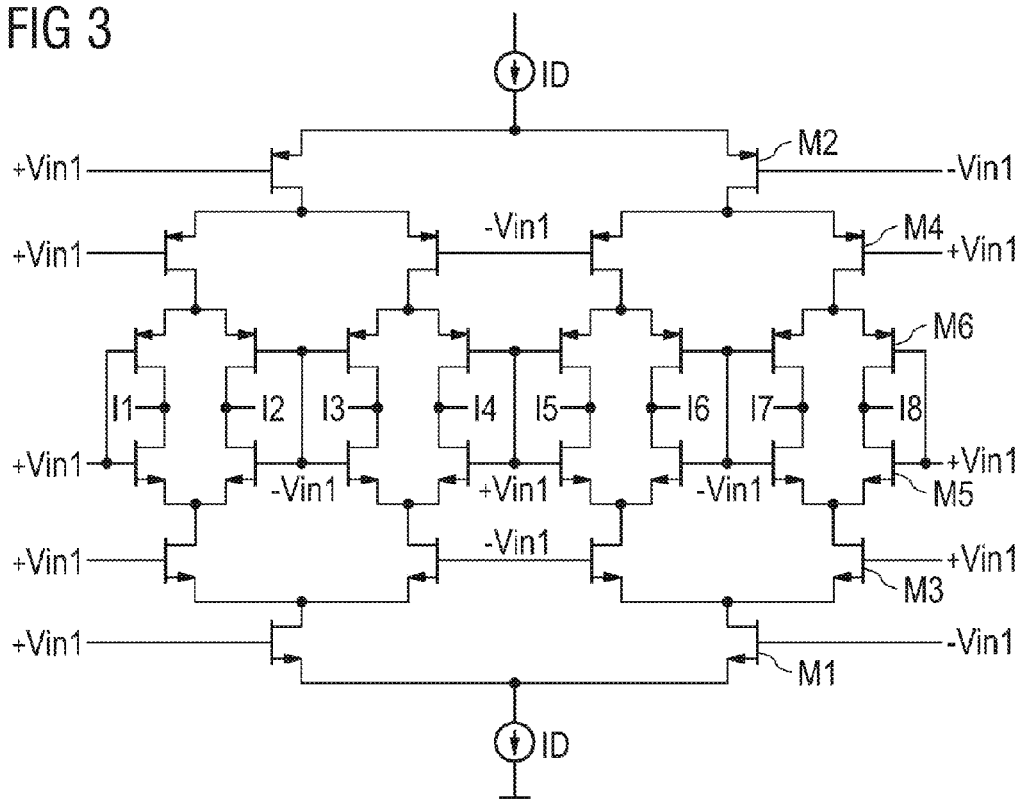

AMPLIFIER ARRANGEMENT

The present application relates to an amplifier arrangement. Amplifier arrangements, for example operational amplifiers, are currently used in a wide field of applications. Operational amplifiers, when implemented in integrated circuits, regularly comprise one or more differential pairs of transistors. The noise power of the differential pair is strongly dependent on the current used. That is, the lower the noise level shall be, the more current is necessary.

However, especially in today's growing market for low power amplifiers in mobile devices, there is a need for amplifiers that can be integrated in a semiconductor device and that achieve both reduced current consumption and increased noise performance.

It is therefore an object of the present application to provide an amplifier arrangement that provides less power consumption at given noise requirements, or increased noise performance at given power consumption, or both.

This object is solved by an amplifier arrangement according to claim 1. Further embodiments are presented in dependent claims.

According to an embodiment, an amplifier arrangement comprises a first differential stage comprising at least two transistors having a first threshold voltage, at least a second differential stage comprising at least two transistors having a second threshold voltage different from the first threshold voltage, at least one of the transistors of the first and second differential stage, respectively, has a control input commonly coupled to an input of the amplifier arrangement, at least one transistor of the first differential stage and one transistor of the second differential stage are arranged in a common current path, which is coupled to an output of the amplifier arrangement.

Since the at least two differential stages use transistors with different threshold voltage, the common mode voltages of both amplifiers may be the same. Therefore, the same input signal can be applied to both differential stages without modifying the common mode level of any of the differential stages.

This in turn allows for designing amplifiers with much lower power consumption at the same noise performance, or much better noise performance at the same level of power consumption, or both. Since at least one transistor of first and second differential stage, respectively, is arranged in a common current path, the current is reused and allows for the desired lower power consumption at the same noise performance.

Preferably, the threshold voltage of the transistors of the second differential stage is lower than the one of the first differential stage.

The difference of the threshold voltages is preferably larger than the saturation voltage of the transistors of the first differential stage. For example, the difference between the threshold voltages may be in an interval between 100 mV and 200 mV.

According to an embodiment, the input of the amplifier arrangement comprises a differential input with two terminals. One of these terminals is being coupled to the control input of at least one transistor of the first differential stage and to the control input of at least one transistor of the second differential stage. A second one of the differential input terminals is coupled to the control input of at least another transistor of the first differential stage and to the control input of at least another transistor of the second differential stage.

It is possible to have the differential inputs of the at least two differential stages connected in parallel to the differential input of the amplifier arrangement.

There is no common mode adjustment for one or both of the inputs of the differential stages necessary according to the present principle.

In a further embodiment, the two transistors of the first differential stage have a common source node and the two transistors of the second differential stage have a common source node. Thus a typical differential stage is formed respectively. However, this kind of a basic differential pair is just one way of implementing the differential stages according to the present principles. Other ways of forming differential stages are within the knowledge of the person skilled in the art.

In a further embodiment, the common source node of the two transistors of the second differential stage is coupled to a drain terminal of one of the transistors of the first differential stage. The second differential stage comprises a further transistor pair having a common source node, the common source node being coupled to a drain terminal of another one of the transistors of the first differential stage, thus forming a cascade structure. This cascade structure is one way of implementing the current reuse principle of the first and the second differential stages.

Of course, it is within the scope of the present application to further develop the cascade principle to a three-stage cascade structure instead of the above presented two-stage cascade structure.

The common current path which involves a first and at least a second differential stage may further comprise a load in one embodiment. The load for example may comprise a resistor, a current source, a current mirror and/or a cascode transistor.

In another embodiment, the complete structure of an amplifier arrangement presented above may be realized symmetrically in a complementary fashion. The term complementary is referring to the type of conductivity of the transistors used.

As such, the arrangement further comprises a complementary first differential stage comprising at least two transistors having opposite conductivity type compared to the transistors of the first differential stage, and comprising at least a complementary second differential stage comprising at least two transistors having opposite conductivity type compared to the transistors of a second differential stage. By doing so, noise power can be further reduced.

In that case, the current path mentioned above may further comprise at least one transistor of the complementary first differential stage, and at least one transistor of the complementary second differential stage.

Preferably, more than one of such common current paths is formed.

It is possible according to the principle presented that not each and every control terminal of the transistors of the differential stages involved is connected to the input of the amplifier arrangement. Alternatively, at least one control input of at least one transistor of the first and/or second differential stage may be connected to a constant bias voltage.

The amplifier arrangement may be constituted by transistors that are of metal oxide semiconductor or other field-effect transistor type.

Alternatively, it is also possible to realize at least some of the transistors, for example those of the first differential stage, using bipolar transistors and building the second differential stage and the further second differential stage—if present—using metal oxide semiconductor transistors, for example.

The different threshold voltage of the transistors of the first and second differential stage, respectively, may be realized in at least one of many different ways.

One way to do this is to define the first threshold voltage by a first thickness of the gate oxide of the transistors of the first differential stage. The second threshold voltage is defined by a second thickness of the gate oxide of the transistors of the second differential stage wherein the first thickness is different from the second thickness.

Alternatively or additionally it is possible to use different doping of the transistors in order to achieve different threshold voltages of the transistors.

Further alternatively or additionally, the threshold voltage can be defined by different bulk voltages of the transistors.

It is also possible to implement differential threshold voltages using dual gate transistors with floating gate.

The present amplifier arrangement will be further explained and illustrated by several embodiments using exemplary schematics.

FIG. 3 shows another example adding a third differential stage to the embodiment of FIG. 2, FIG. 4 shows an additional embodiment as a simplified version of cascading three differential pairs.

Figure 1:
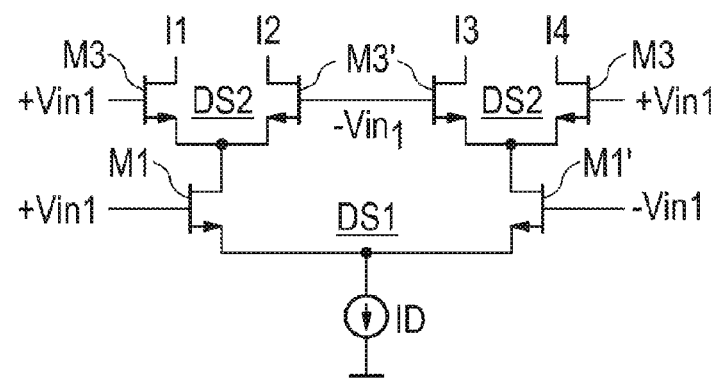
FIG. 1 shows an exemplary embodiment of the present principle.

FIG. 1 shows a first example of an embodiment of an amplifier arrangement according to the present principle. The amplifier arrangement comprises a first differential stage DS1. The first differential stage comprises two MOS transistors M1, M1', the source nodes of which are directly connected together and, via a current source ID, to ground potential. The current source ID supplies the drain current for the two transistors M1, M1'. Each transistor M1, M1' has a control input, namely in this case the respective gate terminal. The two gate terminals of the respective transistors of the first differential stage are forming a differential input, at which a differential input signal +VIN1, −VIN1 can be supplied. Further on, the amplifier arrangement comprises a second differential stage. The second differential stage DS2 comprises two transistor pairs. Each transistor pair comprises two transistors M3, M3' forming a respective differential pair. Each differential pair comprising the two transistors M3, M3' has their source nodes connected directly together and to a drain terminal of a respective transistor M1, M1' of the first differential stage. Thus, a cascade of differential pairs is constituted.

Each differential pair of the second differential stage has a differential input formed at gate terminals of the respective transistors M3, M3'. On the input side, the differential pairs of the second differential stage are connected in parallel to the common differential input of the amplifier arrangement. Therefore, all three differential pairs of the two differential stages are connected in parallel on their input side.

The further processing of the drain currents I1 to I4 given at the four drain terminals of the four transistors M3, M3' of the two differential pairs of the second differential stage are explained later. In the end, an output signal is generated from at least a selection of those four currents.

It should be noted that all transistors M3, M3' of the second differential stage have a second threshold voltage in common which is lower than the first threshold voltage of the two transistors M1, M1' of the first differential stage. The use of transistors M1, M1'; M3, M3' with different threshold voltages allows for the correct bias points even when the common mode voltages of both differential stages are the same and the input signal of both differential stages is the same.

The noise power of the circuit of FIG. 1 is smaller compared to a conventional differential pair with the same current consumption. Alternatively, a significant power reduction with the same noise performance is possible.

The noise power of a differential pair of MOS transistors is calculated from $$v_N^2 = 2*\left(\frac{8*k*T}{3*gm_1}\right) \cdot df$$

The gm in weak inversion is $$gm = \frac{I_D}{n \cdot V_t}, \text{ where } V_t = \frac{k \cdot T}{q}.$$

By replacing gm in the noise power formula we get $$Vn^2 = 2 \cdot \frac{8 \cdot k \cdot T \cdot n \cdot V_t}{3 \cdot I_D} \cdot df.$$

Therefore, it can be seen that the only way to improve the noise performance with conventional means is increasing the bias current.

The noise efficiency factor NEF of the circuit of FIG. 1 is calculated according to $$NEF = \sqrt{\frac{Vn^2 \cdot I_{tot}}{V_t \cdot 4 \cdot k \cdot T}} = \sqrt{\frac{2 \cdot 8 \cdot k \cdot T \cdot n \cdot V_t}{3 \cdot I_D} \frac{2 \cdot I_D}{V_t \cdot 4 \cdot k \cdot T}} = \sqrt{\frac{8 \cdot n}{3}}$$

The four output currents according to FIG. 1 are calculated according to $$I_1 = \frac{+Vin_1 \cdot gm_{M1} + Vin_1 \cdot 2 \cdot gm_{M3}}{4}$$

$$I_2 = \frac{+Vin_1 \cdot gm_{M1} - Vin_1 \cdot 2 \cdot gm_{M3}}{4}$$

$$I_3 = \frac{-Vin_1 \cdot gm_{M1} - Vin_1 \cdot 2 \cdot gm_{M3}}{4}$$

$$I_4 = \frac{-Vin_1 \cdot gm_{M1} + Vin_1 \cdot 2 \cdot gm_{M3}}{4}$$

The output of this circuit is $$I_{OUT} = 2 \cdot I_1 - 2 \cdot I_3.$$

So the gm of the circuit is $$gm = gm_{M1} + 2gm_{M3}.$$

Figure 2:
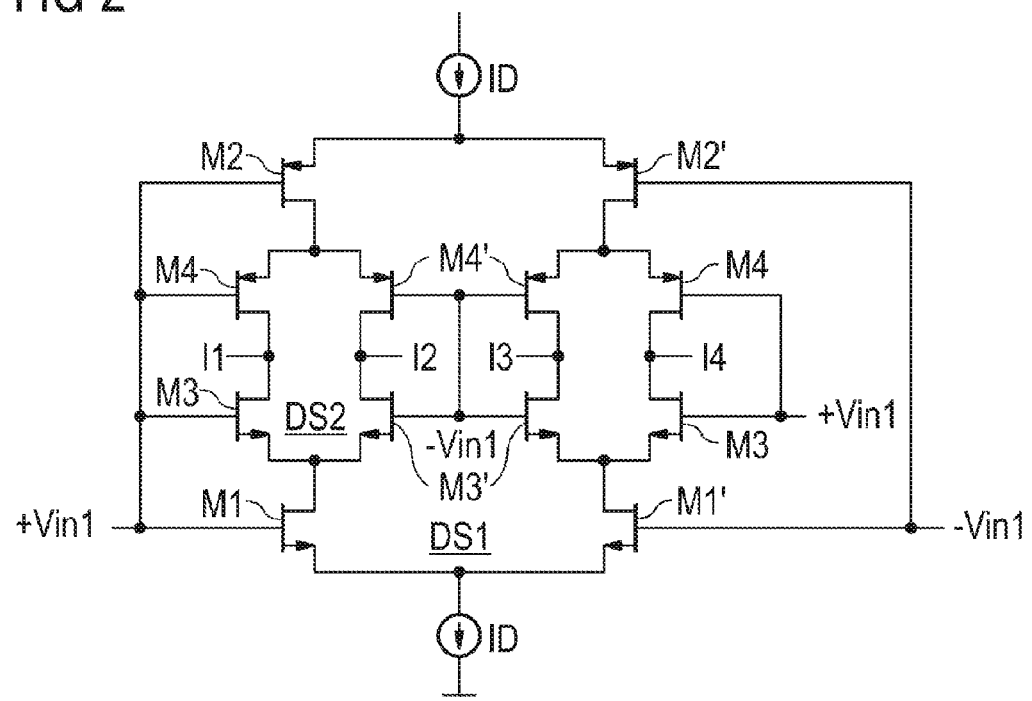
FIG. 2 shows a complementary exemplary embodiment based on the one of FIG. 1.

FIG. 2 shows another exemplary embodiment of the amplifier arrangement according to the proposed principle.

The circuit arrangement is based on the one of FIG. 1 and is not described again in this respect. However, further to the circuit of FIG. 1, the embodiment of FIG. 2 is of a complementary structure. Thus, the structure of FIG. 1 is provided again on top of the one already present, but in a manner of axis mirroring. All the additional transistors provided in FIG. 2 are of opposite conductivity type compared to the ones already present in FIG. 1. Thus, PMOS and NMOS transistors are combined.

The amplifier arrangement of FIG. 2 further comprises a complementary first differential stage comprising two transistors M2, M2' having opposite conductivity type compared to the transistors M1, M1' of the first differential stage, and comprises a complementary second differential stage comprising two pairs of two transistors M4, M4' each having opposite conductivity type compared to the transistors M3, M3' of the second differential stage.

Thus, at least one current branch is formed connecting ground to supply potential and comprising a current source, a transistor of the first differential stage, a transistor of the second differential stage, a transistor of the complementary second differential stage, a transistor of the complementary first differential stage and another current source, series connected in the order of appearance.

When using a complementary structure as shown in FIG. 2, the input related noise is $$v_N^2 = 2 * \left( \frac{8*k*T}{3*(gm_1 + gm_2)} \right) \cdot df$$

With the same current flowing through an NMOS and a PMOS structure we get two times that gm of a differential stage. Thus, for the same noise performance the current consumption is half of the differential stage of FIG. 1.

The noise efficiency factor is $$NEF = \sqrt{\frac{Vn^2 \cdot I_{tot}}{V_t \cdot 4 \cdot k \cdot T}} = \sqrt{\frac{2 \cdot 8 \cdot k \cdot T \cdot n \cdot V_t}{2 \cdot 3 \cdot I_D} \frac{2 \cdot I_D}{V_t \cdot 4 \cdot k \cdot T}} = \sqrt{\frac{4 \cdot n}{3}}$$

By combining the complementary differential pair with the current reuse differential pair as proposed in FIG. 2, the complementary current reuse differential pair as shown in FIG. 2 is achieved. The four output currents are in this example $$I_1 = \frac{+Vin_1 \cdot (gm_{M1} + gm_{M2}) + Vin_1 \cdot 2 \cdot (gm_{M3} + gm_{M4})}{4}$$

$$I_2 = \frac{+Vin_1 \cdot (gm_{M1} + gm_{M2}) - Vin_1 \cdot 2 \cdot (gm_{M3} + gm_{M4})}{4}$$

$$I_3 = \frac{-Vin_1 \cdot (gm_{M1} + gm_{M2}) - Vin_1 \cdot 2 \cdot (gm_{M3} + gm_{M4})}{4}$$

$$I_4 = \frac{-Vin_1 \cdot (gm_{M1} + gm_{M2}) + Vin_1 \cdot 2 \cdot (gm_{M3} + gm_{M4})}{4}$$

The output of the circuit of FIG. 2 is $$I_{OUT} = 2 \cdot I_1 - 2 \cdot I_3.$$

So the gm of this circuit is $$gm = gm_{M1} + gm_{M2} + 2gm_{M3} + 2gm_{M4}.$$

This results in a noise power of $$Vn^2 = 2 \cdot \frac{8 \cdot k \cdot T}{3 \cdot (gm_{M1} + gm_{M2} + 2gm_{M3} + 2gm_{M4})} \cdot df.$$

By choosing $$gm_{M1} = gm_{M2} = 2gm_{M3} = 2gm_{M4},$$

the noise power gets $$Vn^2 = 2 \cdot \frac{8 \cdot k \cdot T}{3 \cdot 4 \cdot gm_{M1}} \cdot df = \frac{4 \cdot k \cdot T}{3 \cdot gm_{M1}} \cdot df.$$

Thus for the same noise performance the current consumption is ¼ of the regular differential stage. The noise efficiency factor in this case is $$NEF = \sqrt{\frac{Vn^2 \cdot I_{tot}}{V_t \cdot 4 \cdot k \cdot T}} = \sqrt{\frac{2 \cdot 8 \cdot k \cdot T \cdot n \cdot V_t}{4 \cdot 3 \cdot I_D} \frac{2 \cdot I_D}{V_t \cdot 4 \cdot k \cdot T}} = \sqrt{\frac{2 \cdot n}{3}}$$

If, according to another embodiment shown in FIG. 3, three differential pairs are cascaded in the complementary manner starting from FIG. 2, the resulting threefold cascade has the following output current:

$$I_{OUT} = 3 \cdot I_1 + I_2 - I_3 + I_4 - I_5 - 3 \cdot I_6 - I_7 + I_8.$$

The gm and the noise power respectively are thus $$gm = gm_{M1} + gm_{M2} + 2 \cdot gm_{M3} + +2 \cdot gm_{M4} + 4 \cdot gm_{M5} + 4 \cdot gm_{M6} \text{ and}$$

$$Vn^2 = 2 \cdot \frac{8 \cdot k \cdot T}{3 \cdot (gm_{M1} + gm_{M2} + 2gm_{M3} + 2gm_{M4} + 4gm_{M5} + 4gm_{M6})} \cdot df.$$

By choosing $$gm_{M1} = gm_{M2} = 2gm_{M3} = 2gm_{M4} = 4gm_{M5} = 4gm_{M5}$$

the noise power gets $$Vn^2 = \frac{8 \cdot k \cdot T}{9 \cdot gm_{M1}} \cdot df$$

It is therefore to be concluded that for the same noise performance the current consumption is ⅙ of the conventional differential stage and the noise efficiency factor is $$NEF = \sqrt{\frac{Vn^2 \cdot I_{tot}}{V_t \cdot 4 \cdot k \cdot T}} = \sqrt{\frac{2 \cdot 8 \cdot k \cdot T \cdot n \cdot V_t}{6 \cdot 3 \cdot I_D} \frac{2 \cdot I_D}{V_t \cdot 4 \cdot k \cdot T}} = \sqrt{\frac{4 \cdot n}{9}}.$$

FIG. 4 shows a simplified version of the circuit of FIG. 3 and another exemplary embodiment of an amplifier arrangement according to the proposed principle. The circuit of FIG. 4 has three cascaded differential stages similar to FIG. 3 but, similar to FIG. 1 does not comprise a complementary section that is axis mirrored. The circuit of FIG. 3 is further simplified by combining current branches that have the same structure and the same signals, resulting in some transistors of the third differential stage having the double channel width than other transistors of the same stage.

The output current of this circuit is $$I_{OUT}=3 \cdot I_1+I_2-I_3-3 \cdot I_4.$$

Figure 5:
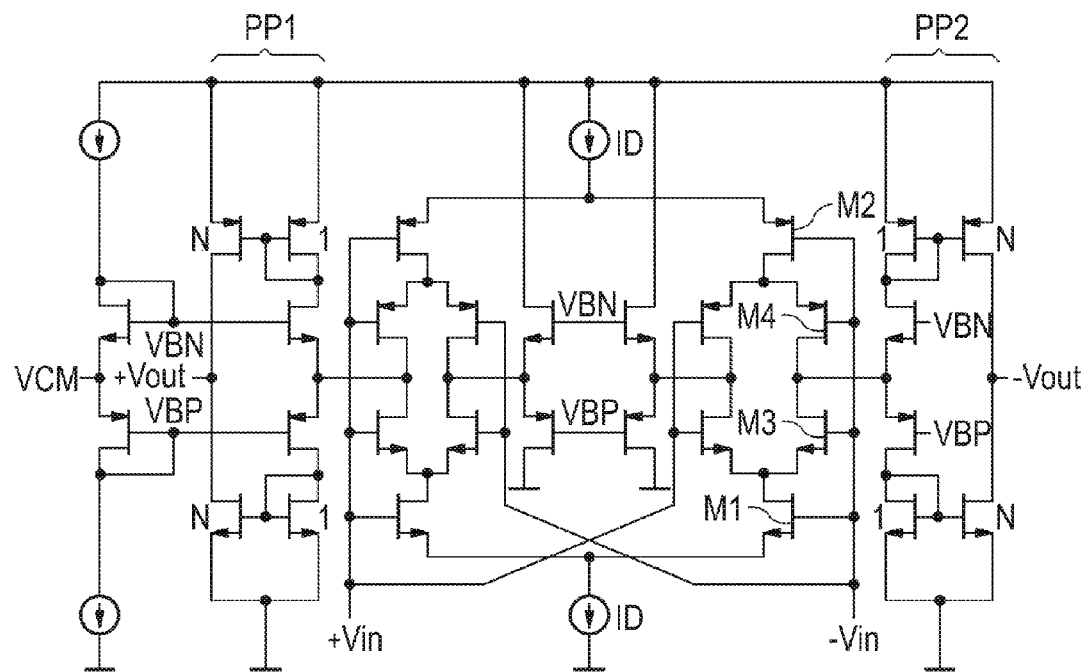
FIG. 5 shows an embodiment using current mirrors for providing the output of the amplifier.

Another exemplary embodiment of the proposed principle is shown in FIG. 5. The example of FIG. 5 is based on the structure of FIG. 2 and further developed to obtain a transconductance amplifier OTA. The current outputs are fed into two push-pull current mirrors PP1, PP2 that are shown in FIG. 5 on both sides of the complementary two differential stages shown in the center. Also as in FIG. 2 the differential inputs of all differential stages are connected directly in parallel to form the common differential amplifier input where the differential input signal +VIN, −VIN can be fed in.

The differential voltage output is formed at the output sides of the two push pull current mirror stages. There, the differential output voltage +VOUT, −VOUT can be tapped of.

Due to the principle of having different threshold voltage transistors for the differential stages of the amplifier, the same common mode voltage can be used for the whole amplifier arrangement and this is defined at the bias current branch on the very left of the embodiment of FIG. 5.

The circuit of FIG. 5 provides a fully differential operational transconductance amplifier OTA with complementary cascaded twofold input stage including the current mirrors PP1, PP2 for a full swing output. The current mirrors PP1, PP2 have the ratio 1:N defined by the ratio of the current mirror transistors respectively.

Figure 6:
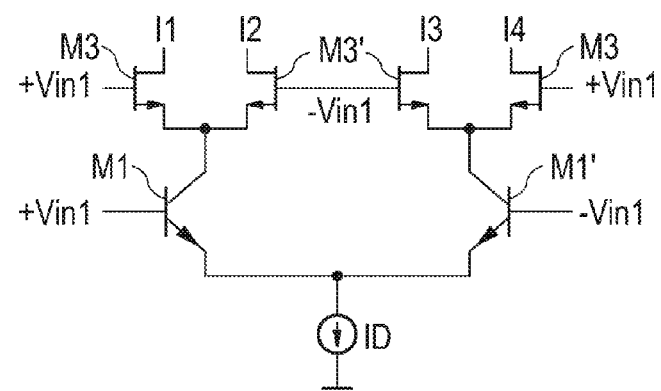
FIG. 6 shows an embodiment using BiCMOS technology.

FIG. 6 shows another exemplary embodiment of an amplifier arrangement according to the proposed principle. The arrangement is based on the embodiment of FIG. 1 but contrary to that the embodiment of FIG. 6 implements a combination of bipolar transistors and MOS transistors. As to that, the first differential stage DS1 is realized using two NPN transistors instead of two MOS transistors M1, M1'. Accordingly, instead of connecting the source terminals as in FIG. 1 the emitter terminals of the transistors M1, M1' are directly connected together and via the current source ID to ground.

The second differential stage DS2 comprising the two differential pairs each comprising two MOS transistors M3, M3' is equal to the one shown in FIG. 1 and therefore not described again here.

Also the functionality of the circuit of FIG. 6 basically corresponds to the one of FIG. 1. Combining bipolar and MOS transistors gives the corresponding functionality as using MOS transistors with different threshold voltage. Thus similar to FIG. 1 with this embodiment shown in FIG. 6 all input terminals of all differential pairs of all differential stages can be directly connected together in a parallel fashion on the input side of the amplifier arrangement.

The generation of different threshold voltages can be done by the person skilled in the art using different transistor designs. For example using different gate oxide thicknesses or different doping or different threshold implant results in the desired effect.

Alternatively the generation of different threshold voltages can be done using dual gate technology with floating gate. Also, the generation of different threshold voltages can be done using different bulk voltages.

Alternative to the embodiments shown above, it is possible to connect one or more gate terminals of the MOS transistors involved to a bias voltage which is constant instead of applying the input voltage. Thus the basic effect of the proposed principle can still be achieved.

Alternative to the implementation shown in FIG. 5, the load of the differential pair that can be applied to any of the circuits shown above can be selected from the following: Current mirror, current source, resistor, cascode or folded cascode.

The invention claimed is:

1. An amplifier arrangement, comprising:
   a first differential stage comprising at least two transistors having a first threshold voltage,
   at least a second differential stage comprising at least two transistors having a second threshold voltage different from the first threshold voltage,
   at least one of the transistors of the first and second differential stage, respectively, has a control input commonly coupled to an input of the amplifier arrangement,
   at least one transistor of the first differential stage and one transistor of the second differential stage are arranged in a common current path, which is coupled to an output of the amplifier arrangement, and
   the input of the amplifier arrangement comprising a differential input with two terminals, a first of which being coupled to the control input of at least one transistor of the first differential stage and to the control input of at least one transistor of the second differential stage, and a second of the differential input terminals being coupled to the control input of at least another transistor of the first differential stage and to the control input of at least another transistor of the second differential stage.

2. The amplifier arrangement of claim 1, in which the two transistors of the first differential stage have a common source node, and in which the two transistors of the second differential stage have a common source node.

3. The amplifier arrangement of claim 2, in which the common source node of the two transistors of the second differential stage is coupled to a drain terminal of one of the transistors of the first differential stage, and wherein the second differential stage comprises a further transistor pair having a common source node, the common source node being coupled to a drain terminal of another one of the transistors of the first differential stage, thus forming a cascade structure.

4. The amplifier arrangement of claim 1, wherein the common current path further comprises a load.

5. The amplifier arrangement of claim 4, the load comprising at least one of the following: a resistor, a current source, a current mirror, a cascode transistor.

6. An amplifier arrangement comprising:
   a first differential stage comprising at least two transistors having a first threshold voltage,
   at least a second differential stage comprising at least two transistors having a second threshold voltage different from the first threshold voltage,
   at least one of the transistors of the first and second differential stage, respectively, has a control input commonly coupled to an input of the amplifier arrangement,
   at least one transistor of the first differential stage and one transistor of the second differential stage are arranged in a common current path, which is coupled to an output of the amplifier arrangement, and
   a complementary first differential stage comprising at least two transistors having opposite conductivity type compared to the transistors of the first differential stage, and comprising at least a complementary second differential stage comprising at least two transistors having opposite conductivity type compared to the transistors of the second differential stage.

7. The amplifier arrangement of claim 1, in which at least one control input of one transistor of the first and/or second differential stage is connected to a constant bias voltage.

8. The amplifier arrangement of claim 1, in which the transistors are of Metal Oxide Semiconductor or other field-effect transistor type.

9. The amplifier arrangement of claim 1, wherein the first threshold voltage is defined by a first thickness of the gate oxide of the transistors of the first differential stage, and wherein the second threshold voltage is defined by a second thickness of the gate oxide of the transistors of the second differential stage, different from the first thickness.

10. The amplifier arrangement of claim 1, wherein the first threshold voltage is defined by a first doping of the transistors of the first differential stage, and wherein the second threshold voltage is defined by a second doping of the transistors of the second differential stage, different from the first doping.

11. The amplifier arrangement of claim 1, wherein the first threshold voltage is defined by a first bulk voltage of the transistors of the first differential stage, and wherein the second threshold voltage is defined by a second bulk voltage of the transistors of the second differential stage, different from the first bulk voltage.

12. The amplifier arrangement of claim 1, wherein the first and second threshold voltage is defined by respective dual gate transistors with floating gate.

* * * * *